(12) United States Patent
Su et al.

(10) Patent No.: US 6,797,144 B2
(45) Date of Patent: Sep. 28, 2004

(54) METHOD FOR REDUCING SURFACE DEFECTS IN AN ELECTRODEPOSITION PROCESS

(75) Inventors: Hung-Wen Su, Jubei (TW); Shih-Wei Chou, Taipei (TW); Ching-Hua Hsieh, Hsinchu (TW); Shau-Lin Shue, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 310 days.

(21) Appl. No.: 10/141,277

(22) Filed: May 8, 2002

(65) Prior Publication Data

US 2003/0209444 A1 Nov. 13, 2003

(51) Int. Cl.[7] ................................................. C25D 7/12
(52) U.S. Cl. ........................ 205/157; 205/220; 205/221; 205/291; 205/292; 205/660; 205/799
(58) Field of Search ................................. 205/157, 220, 205/221, 291, 292, 660, 799

(56) References Cited

U.S. PATENT DOCUMENTS

2003/0209445 A1 * 11/2003 Talieh et al. ................. 205/157

* cited by examiner

Primary Examiner—Robert R. Koehler
(74) Attorney, Agent, or Firm—Tung & Associates

(57) ABSTRACT

A method for in-situ cleaning an electrodeposition surface following an electroplating process including providing a first electrode assembly and a second electrode assembly; applying a first current density across the first electrode assembly and the second electrode assembly for carrying out the electrodeposition process; carrying out the electrodeposition process to electrodeposit a metal onto an electrodeposition surface of the second electrode assembly; and, applying a second current density having a second polarity reversed with reference to the first polarity across the first electrode assembly and the second electrode assembly the second current density having a relatively lower current density compared to the first current density.

20 Claims, 2 Drawing Sheets

METHOD FOR REDUCING SURFACE DEFECTS IN AN ELECTRODEPOSITION PROCESS

FIELD OF THE INVENTION

This invention generally relates to metallic electrodeposition and more particularly to a method for reducing surface defects including attached metal particles in an electrodeposition process, the method particularly useful for semiconductor wafer electrodeposition processes.

BACKGROUND OF THE INVENTION

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron dimensions, whereas the thickness of the dielectric layers, through the use low-k (low dielectric constant) materials, has remained substantially constant. Consequently, the aspect ratios for the features, i.e., their height divided by width, has increased thereby creating additional challenges in adequately filling the sub-micron features with, for example, copper metal. Many traditional deposition processes such as chemical vapor deposition (CVD) have difficulty filling increasingly high aspect ratio features, for example, where the aspect ratio exceeds 2:1, and particularly where it exceeds 4:1.

As a result of these process limitations, electroplating or electrodeposition, which has previously been limited to the fabrication of patterns on circuit boards, is now emerging as a preferable method for filling metal interconnects structures such as via openings (holes) and trench line openings on semiconductor devices. Typically, electroplating uses an electrolyte including positively charged ions of deposition material, for example metal ions, in contact with a negatively charged substrate (cathode) having a source of electrons to deposit (plate out) the metal ions onto the charged substrate, for example, a semiconductor wafer. A thin metal layer (seed layer) is first deposited on the semiconductor wafer to form a liner in high aspect ratio anisotropically etched features to provide a continuous electrical path across the surfaces. An electrical current is supplied to the seed layer whereby the semiconductor wafer surface including etched features are electroplated with an appropriate metal, for example, aluminum or copper, to fill the features.

One exemplary process for forming a series of interconnected multiple layers, for example, is a damascene or dual damascene process. Although there are several different manufacturing methods for manufacturing damascene structures, all such methods employ a series of photolithographic masking and etching steps, typically by a reactive ion etch (RIE). In the typical multilayer semiconductor manufacturing process, for example, a series insulating layers are deposited to include a series of interconnecting metallization structures such as vias and metal line interconnects to electrically interconnect areas within the multilayer device and contact layers to interconnect the various devices on the chip surface. In most devices, pluralities of vias are separated from one another along the semiconductor wafer and selectively interconnect conductive regions between layers of a multilayer device. Metal interconnect lines typically serve to selectively interconnect conductive regions within a layer of a multilayer device. Vias and metal interconnect lines are selectively interconnected in order to form the necessary electrical connections.

In filling the via openings and trench line openings with metal, for example, copper, electroplating is a preferable method to achieve superior step coverage of sub-micron etched features. The method generally includes first depositing a barrier layer over the etched opening surfaces, such as via openings and trench line openings, depositing a metal seed layer, for example copper, over the barrier layer, and then electroplating a metal, for example copper, over the seed layer to fill the etched features to form conductive vias and trench lines. Finally, the electro deposited layer and the dielectric layers are planarized, for example, by chemical mechanical polishing (CMP), to define a conductive interconnect feature.

Metal electroplating (electrodeposition) in general is a well-known art and can be achieved by a variety of techniques. Common designs of cells for electroplating a metal on semiconductor wafers involve positioning the plating surface of the semiconductor wafer within an electrolyte solution including an anode with the electrolyte impinging perpendicularly on the plating surface. The plating surface is contacted with an electrical power source forming the cathode of the plating system such that ions in the plating solution deposit on the conductive portion of the plating surface, for example a semiconductor wafer surface.

More recent electroplating processes use a relatively high current, for example 100 to 1000 mA/cm$^2$, to improve semiconductor wafer throughput. During the electroplating process anisotropically etched features are filled with for example, a copper or copper alloy metal in, for example, dual damascene structures. One problem according to prior art electrodeposition processes is that copper particles, for example as large as 0.2 microns, remain attached to the plating surface following the electrodeposition process.

For example, referring to FIG. 1 is shown a portion of a semiconductor process surface showing a cross sectional side view of a dual damascene structure 10 made up of a via portion 10A and an overlying trench line portion 10B. The dual damascene structure 10 is formed in an insulating layer 12 having, for example, a barrier layer 14A of TaN nitride conformally deposited to over the via and trench sidewalls and via bottom portion and an overlying conformally deposited seed layer 14B, for example, copper typically deposited by physical vapor deposition (PVD) or chemical vapor deposition (CVD). During a typical electroplating process a major portion of the damascene structure 10 is filled with, for example, copper to form copper layer 18 by a high current electrodeposition process. Following the high current electrodeposition process copper particles e.g., 18A, 18B, remain attached on the surface of the copper layer 18. Following the electrodeposition process, a chemical mechanical polishing (CMP) process is carried out to polish back the excess copper layer 18 to achieve a planarized surface. During the CMP process, the copper particles e.g., 18A, 18B with a particle size of, for example, up to 0.2 microns are dislodged from the surface of the copper layer 18 and contribute to undesirable scratching of the semiconductor surface during CMP. As a result, semiconductor wafer quality and yield are adversely affected.

These and other shortcomings demonstrate a need in the semiconductor processing art to develop a method for electrodeposition whereby attached copper particle defects remaining on the electrodeposition surface following the deposition process are reduced or avoided.

It is therefore an object of the invention to provide a method for electrodeposition whereby attached copper particle defects remaining on the electrodeposition surface following the deposition process are reduced or avoided while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for in-situ cleaning an electrodeposition surface following an electroplating process.

In a first embodiment, the method includes providing a first electrode assembly and a second electrode assembly relatively disposed to carry out an electrodeposition process in an electrolyte bath; applying a first current density according to an applied potential with a first polarity across the first electrode assembly and the second electrode assembly for carrying out the electrodeposition process at a first current density; carrying out the electrodeposition process to electrodeposit a metal onto an electrodeposition surface of the second electrode assembly; and, applying a second current density according to an applied potential having a second polarity reversed with reference to the first polarity across the first electrode assembly and the second electrode assembly the second current density having a relatively lower current density compared to the first current density.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

In the method and apparatus according to the present invention, the invention is explained by reference to electrodeposition of copper to fill an anisotropically etched feature, for example, a dual damascene structure. It will be appreciated, however, that the method of the present invention may be advantageously applied to the electrodeposition (electroplating) of any metal onto an electrode surface where a an electrodeposition method is used. In one embodiment of the invention, a relatively lower current density compared to the electrodeposition current density is applied according to a reversed electrode polarity with a reversed current following a an electrodeposition process to advantageously reduce or prevent the formation of attached metal particle defects.

Figure 1:
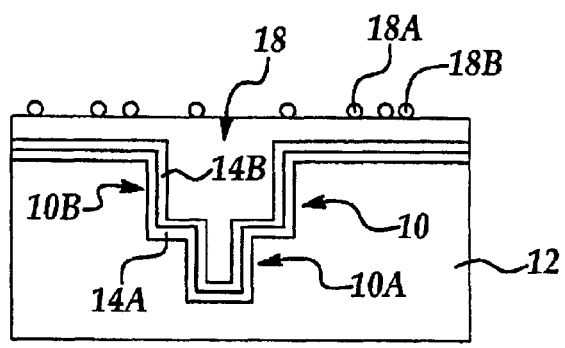
FIG. 1 is a side view representations of a portion of a semiconductor wafer showing an anisotropically etched feature filled with metal in an electrodeposition process according to the prior art.
Figure 2A:
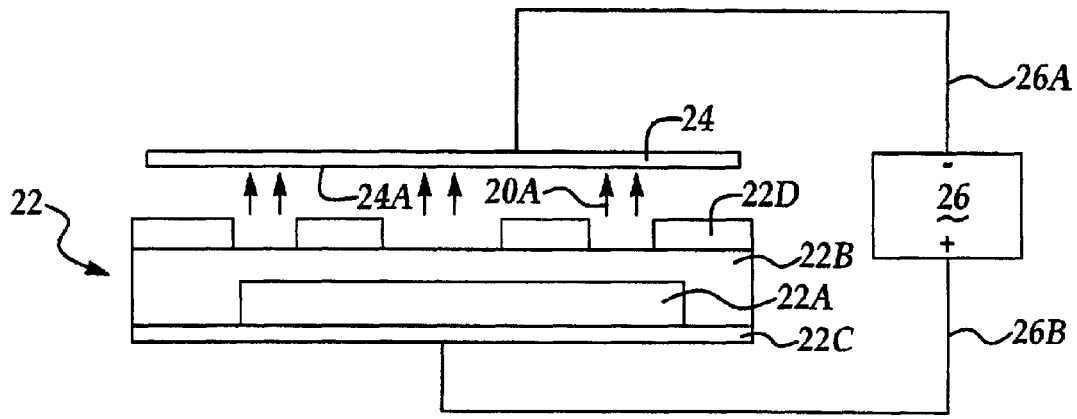
FIGS. 2A and 2B are conceptual cross sectional side view representations of an electrode assembly arrangement and electrolyte current flow according to the present invention.

For example, referring to FIG. 2A is shown a schematic representation (not showing the electrolyte container) of the relationship of a typical high current electrodeposition anode assembly 22 to a semiconductor wafer 24 in a typical electroplating (electrodeposition) process. The anode assembly 22, includes an anode 22A, for example, formed of copper or an alloy thereof for supplying copper ions for copper electroplating. The anode 22A, is for example, surrounded by a titanium top plate, 22B and a titanium bottom plate 22C. An anode pad e.g., 22D covers the titanium top plate 22B for directing an electrolytic current flow indicated by directional arrows e.g., 20A to the semiconductor wafer 24 for electroplating, for example, copper, onto the semiconductor wafer surface 24A. An electrical potential is created between the anode assembly 22 and the semiconductor wafer 24 (cathode) by power source 26 which is shown in schematic representation in electrical communication with the semiconductor wafer 24 (cathode) by communication line 26A and anode assembly 22 by communication line 26B. It will be appreciated that the power source may be controlled to deliver a predetermined current density for a predetermined period of time according to a predetermined waveform by methods known in the art.

In operation, the anode assembly 22 and semiconductor wafer surface 24A are positioned so that an electrolyte carries 15 positively charged copper ions, supplied from the anode, to the negatively charged semiconductor wafer (cathode) where the positively charged copper ions are plated out by a reduction reaction onto the semiconductor wafer surface 24A. The electrolyte solution includes, for example, copper sulfate and may be an acidic or basic solution including complexing agents as is known in the art. Preferably, the method according to the present invention is applied following a high current electrodeposition process although it is not limited thereto. In a typical high current electrodeposition process also referred to as electro-cathodic metal deposition (ECD or ECMD), the current may range from a current density of about 200 to about 1000 mA/cm$^2$. More preferably, the current density is about 600 mA/cm$^2$.

Figure 3A:
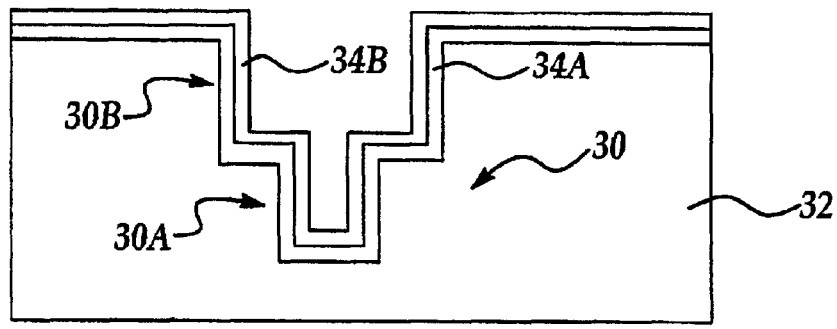
FIGS. 3A–3C are side view representations of a portion of a semiconductor wafer showing an exemplary dual damascene structure and filled with metal in an electrodeposition process according to the present invention.

In an exemplary process, for example, referring to FIG. 3A, is shown a portion of a semiconductor wafer including an anisotropically etched dual damascene structure 30 having a via portion 30A and an overlying trench line portion 30B. While there are several ways to form a dual damascene structure, one approach involves at least two photolithographic patterning and anisotropic etching steps to first form a via opening e.g., 30A, followed by a similar process to form an overlying trench line opening 30B. The dual damascene structure 30 is formed in an insulating layer 32, for example a low dielectric constant doped oxide, formed for example by plasma enhanced CVD (PECVD). A barrier layer 34A of for example, TaN nitride, is conformally deposited to cover the sidewalls and bottom portion of the anisotropically etched via opening 30A and sidewalls of the trench opening 30B. The barrier layer 34A serves the purpose of preventing copper diffusion into the surrounding insulating layer 32. Following barrier layer 34A deposition, a seed layer 34B of copper or copper alloy is conformally deposited over the barrier layer 34A by, for example PVD or CVD. The copper seed layer 34B is preferably conformably deposited to form a continuous layer. The copper seed layer 34B provides a conductive surface for a subsequent electrodeposition process whereby an electrical potential is applied to the seed layer by cathode contacts contacting, for example, the outer peripheral edges of the semiconductor wafer.

Figure 3B:
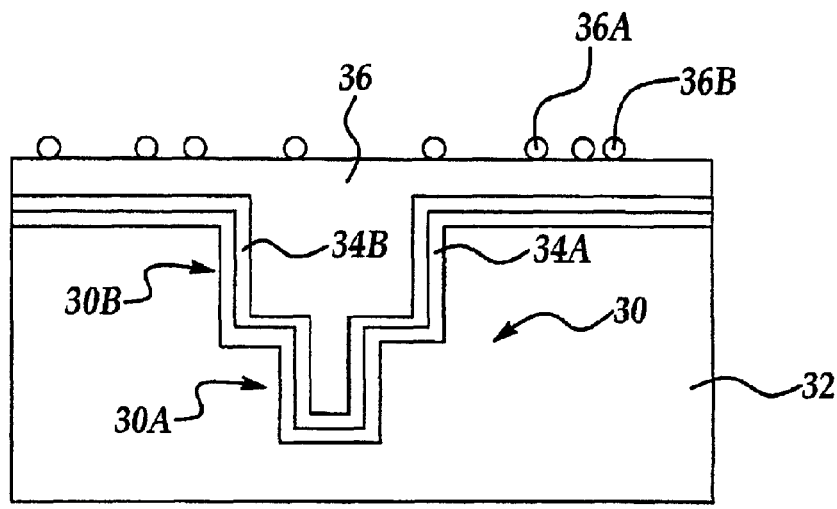

Following deposition of the seed layer 34B, the semiconductor wafer is positioned in an electrolyte bath (not shown) in proximity with an anode assembly as shown in FIG. 2A. An electrical potential is applied to the cathode and anode creating the flow of, for example, copper ions from the anode to the semiconductor wafer cathode where they deposit on the semiconductor surface, for example, the seed layer 34B to form a copper layer 36 to fill the dual damascene anisotropically etched feature as shown in FIG. 3B. The electrical potential is applied such that the electrodeposition takes place at a high current, for example between about 100 to about 1000 $mA/cm^2$, more preferably, the current density is about 600 $mA/cm^2$. Still referring to FIG. 3B, following the high current electrodeposition process, copper particles e.g., 36a, 36B, for example having a diameter from about 0.1 to about 0.2 microns, remain attached on the copper layer 36.

Figure 2B:
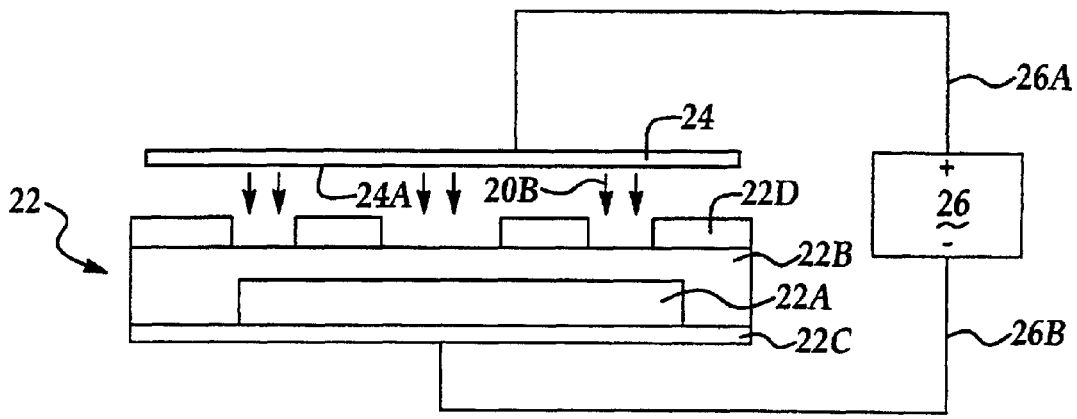
Figure 3C:
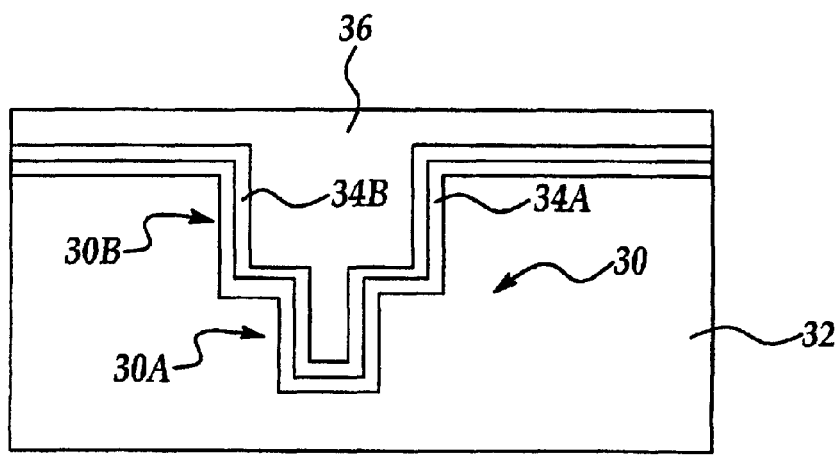

Referring to FIG. 2B, according to the present invention, in one embodiment, following the high current density electrodeposition process, a relatively lower density with reversed current (reversed current mode) is applied according to a reversed polarity whereby the semiconductor wafer 24 becomes the anode and the anode assembly 22 becomes the cathode with metal ions, for example copper, reversing a direction of current flow to dissolve copper from the semiconductor wafer surface 24A and deposit on the anode assembly 22 (cathode in reversed current mode) as shown by directional arrows e.g. 20B. It will be appreciated that more than one electrode may be used as the cathode in the reversed current mode, for example, one or more dummy electrodes may be used to alter a current flow or electric field. For example, the anode assembly may have additional electrode assemblies surrounding it to alter a current flow and may be operated independently of anode assembly 22. The relatively lower current density in the reversed current mode is preferably applied following substantial completion of the high current electrodeposition including substantially completing the deposition of metal layer, for example copper layer 36 in FIG. 3B, to fill the dual damascene structure. The relatively lower current density in the reversed current mode, according to the present invention is preferably between about 5 to about 80 $mA/cm^2$, more preferably about 50 $mA/cm^2$. The application of a reversed current according to a reversed polarity (reversed current mode) following the electrodeposition process according to the present invention operates to remove the copper particles e.g., 36A, 36B from the copper layer 36 surface (electrodeposition surface) as shown in FIG. 3C.

It is believed that the copper particles are not grown from the bulk of the copper layer 36, but are formed at the electrodeposition surface towards the end of, or following, the high current electrodeposition process thereby attaching to the electrodeposition surface including some degree of physical attachment. It has been found that a relatively lower reversed current density according to the present invention is sufficient to remove the copper particles from the semiconductor surface. The attached copper particles may be as large as 0.2 microns in diameter, and cause scratching in subsequent CMP processes if allowed to remain. It will be appreciated that larger or smaller metal particles may be removed as well, according to the present invention. The method according to the present invention advantageously reduces and preferably avoids the presence of adhering metal particles, for example copper, following a high current electrodeposition process thereby reducing and preferably avoiding subsequent scratching of the semiconductor surface in a subsequent CMP process.

It will be appreciated that the time required to remove the copper particles will vary with the current density, however, it has been found that a period of time from about 5 seconds to about 60 seconds is usually sufficient when applying the reverse current according to the present invention over a density range of 5 to about 80 $mA/cm^2$. It will be further appreciated that the reversed current mode according to the present invention may be operated with in a continuous manner with continuous applied power or a pulsed manner according to pulsed applied power. For example, preferably, power pulses supplying a current density are applied for about period of about 10 to about 500 milliseconds.

In an exemplary implementation of one embodiment of the present invention, an optical scanning tool for automated detection of the copper metal particles was used to determine the number of copper particles present following an exemplary high current electrodeposition process and following the implementation of one embodiment of the present invention. For example, before the reversed current treatment according to one embodiment of the present invention following a high current electrodeposition process (e.g., 600 $mA/cm^2$), about 200 copper particle defects remaining on the electrodeposition surface were determined to be present according to optical scanning. In contrast, following the reversed current treatment according to one embodiment of the present invention, using a current density of about 50 $mA/cm^2$ for about 10 seconds, the number of copper particles were reduced by about 90 to 100 percent, more frequently completely eliminating the presence of the copper particles from the electrodeposition surface The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for in-situ cleaning an electrodeposition surface following an electroplating process comprising the steps of:

provide a first electrode assembly and a second electrode assembly relatively disposed to carry out an electrodeposition process in an electrolyte bath;

applying a first current density according to an applied potential with a first polarity across the first electrode assembly and the second electrode assembly for carrying out the electrodeposition process at a first current density;

carrying out the electrodeposition process to electrodeposit a metal onto an electrodeposition surface of the second electrode assembly; and applying a second current density according to an applied potential having a second polarity reversed with reference to the first polarity across the first electrode assembly and the second electrode assembly the second current density having a relatively lower current density compared to the first current density.

2. The method of claim 1, wherein the second electrode assembly comprises a semiconductor wafer.

3. The method of claim 2, wherein the first electrode assembly includes a copper containing anode for supplying the metal including copper for electrodeposition onto the semiconductor surface.

4. The method of claim 3, wherein the electrodeposition surface includes anisotropically etched features for filling with the metal.

5. The method of claim 1, wherein the step of applying a second current density is performed following substantial completion of the electrodeposition process.

6. The method of claim 1, wherein the first current density include a current density from about 100 mA/cm$^2$ to about 1000 mA/cm$^2$.

7. The method of claim 1, wherein the second current density includes a current density from about 5 mA/cm$^2$ to about 80 MA/cm$^2$.

8. The method of claim 7, wherein the step of applying a second current density is carried out from about 5 seconds to about 60 seconds.

9. The method of claim 1, wherein the step of applying a second current density is applied for a sufficient period of time to remove adhering metal particles from the electrodeposition surface.

10. The method of claim 1, wherein at least one of the first current density and second current density is applied according to sequentially applied power pulses.

11. A method for in-situ cleaning an electrodeposition surface following a high current electroplating process comprising the steps of:

providing a first electrode assembly and a second electrode assembly relatively disposed to carry out a high current electrodeposition process in an electrolyte bath;

applying a first current density according to an applied potential with a first polarity across the first electrode assembly and the second electrode assembly for carrying out the electrodeposition process at a first current density;

carrying out the electrodeposition process to electrodeposit a metal onto an electrodeposition surface of the second electrode assembly; and applying a second current density according to an applied potential having a second polarity reversed with reference to the first polarity across the first electrode assembly and the second electrode assembly the second current density having a relatively lower current density compared to the first current density to remove metal particles from the electrodeposition surface.

12. The method of claim 11, wherein the second electrode assembly comprises a semiconductor wafer.

13. The method of claim 12, wherein the first electrode assembly includes a copper containing anode for supplying the metal including copper for electrodeposition onto the semiconductor surface.

14. The method of claim 13, wherein the electrodeposition surface includes anisotropically etched features for filling with the metal.

15. The method of claim 11, wherein the step of applying a second current density is performed following substantial completion of the electrodeposition process.

16. The method of claim 11, wherein the first current density include a current density from about 100 mA/cm$^2$ to about 1000 mA/cm$^2$.

17. The method of claim 11, wherein the second current density includes a current density from about 5 mA/cm$^2$ to about 80 mA/cm$^2$.

18. The method of claim 17, wherein the step of applying a second current density is carried out from about 5 seconds to about 60 seconds.

19. The method of claim 11, wherein at least one of the first current density and second current density is applied according to sequentially applied power pulses.

20. The method of claim 11, wherein the metal particles are less than about 0.2 microns and attached to electrodeposition surface.

* * * * *